United States Patent
Sakamoto et al.

(10) Patent No.: US 7,509,629 B2
(45) Date of Patent: Mar. 24, 2009

(54) METHOD FOR SYSTEM AND ARCHITECTURE DESIGN USING UNIFIED MODELING LANGUAGE (UML)

(75) Inventors: Masaharu Sakamoto, Yokohama (JP); Takaaki Murao, Yokohama (JP); Naoto Sato, Kawasaki (JP); Shin Saito, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 728 days.

(21) Appl. No.: 11/126,614

(22) Filed: May 11, 2005

(65) Prior Publication Data

US 2005/0261884 A1 Nov. 24, 2005

(30) Foreign Application Priority Data

May 14, 2004 (JP) ............................. 2004-144714

(51) Int. Cl.
*G06F 9/44* (2006.01)
*G06F 9/45* (2006.01)
*G06F 3/048* (2006.01)
*G06G 7/48* (2006.01)

(52) U.S. Cl. ...................... 717/105; 717/100; 717/104; 717/124; 717/125; 703/6; 703/22; 715/771; 715/772

(58) Field of Classification Search ................. 717/100, 717/104, 105, 124, 125; 703/6, 22; 715/771, 715/772
See application file for complete search history.

(56) References Cited

U.S. PATENT DOCUMENTS

| | | | |
|---|---|---|---|
| 6,343,265 B1 * | 1/2002 | Glebov et al. .................. 703/25 |
| 7,047,518 B2 * | 5/2006 | Little et al. .................. 717/108 |
| 7,137,100 B2 * | 11/2006 | Iborra et al. ................. 717/106 |
| 7,275,096 B2 * | 9/2007 | Green .......................... 709/223 |
| 2002/0019971 A1 * | 2/2002 | Zygmont et al. ............... 717/1 |
| 2002/0022942 A1 * | 2/2002 | Nakamura ................... 702/182 |
| 2002/0104068 A1 * | 8/2002 | Barrett et al. ............... 717/104 |
| 2005/0256692 A1 * | 11/2005 | Monin et al. ................. 703/22 |

FOREIGN PATENT DOCUMENTS

JP 2004-318654 A2 11/2004

OTHER PUBLICATIONS

Arief et al., "A UML Tool for an Automatic Generation of Simulation Programs," Sep. 2000, ACM, p. 71-76.*
Bertolino et al., "Real-Time UML-based Performance Engineering to Aid Manager's Decisions in Multi-project Planning," Jul. 2002, ACM, p. 251-261.*

(Continued)

*Primary Examiner*—Wei Y Zhen
*Assistant Examiner*—Qing Chen
(74) *Attorney, Agent, or Firm*—Louis P. Herzberg; Shimokaji & Associates, P.C.

(57) ABSTRACT

To provide a UML design method by which architecture design pursuing optimal design parameters while viewing the overall target system on the UML model can be performed. A UML design method of the present invention is a UML design method for performing design by modeling a target system based on Unified Modeling Language (UML), using a profile storing a design parameter, the method including the steps of: storing a stereotype and a tagged value in the profile as the design parameters; annotating a UML model of the target system with the stored stereotype and tagged value; and associating the added stereotype and tagged value with each class constituting the UML model, and displaying the stereotype and tagged value and the UML model, which are associated, on a graphical user interface.

3 Claims, 9 Drawing Sheets

OTHER PUBLICATIONS

Balsamo et al., "A simulation-based approach to software performance modeling," Sep. 2003, ACM, p. 363-366.*

Gu et al., "Early Evaluation of Software Performance based on the UML Performance Profile," Oct. 2003, IBM Press, p. 1-14.*

Green et al., "The Modelling of Embedded Systems Using HASoC," Mar. 2002, IEEE.*

Selic, Bran, "The Real-Time UML Standard: Definition and Application," Mar. 2002, IEEE.*

Zhu et al., "An Object-Oriented Design Process for System-on-Chip using UML," Oct. 2002, ACM, p. 249-254.*

Ledeczi et al., "Modeling Methodology for Integrated Simulation of Embedded Systems," Jan. 2003, ACM, p. 82-103.*

"New SoC Design Methodology based on UML and C Programming Languages," 2002, p. 3-6.*

"A UML Extension Profile for SoC," Oct. 2004, p. 1-14.*

Ryuichi Hosoya, "To learn about the concept of MDA and Architecture," Java World, IDG Japan, Inc., May 1, 2004, pp. 86-94, vol. 8, No. 5.

Grant Martin, "Embedded UML: a merger of real-time UML and co-design," Proceedings of the ninth international symposium on hardware/software co-design, ACM, 2001, pp. 23-28.

Japanese Publication No. 2001-318812 published on Nov. 16, 2001.

* cited by examiner

METHOD FOR SYSTEM AND ARCHITECTURE DESIGN USING UNIFIED MODELING LANGUAGE (UML)

FIELD OF THE INVENTION

The present invention relates to a Unified Modeling Language (UML) design method.

BACKGROUND OF THE INVENTION

These days, there is a strong rapidly increasing trend to satisfy the needs of a system on chip (hereinafter referred to as SoC,), on which a high performance and multi-functional processor is integrated on a single chip. In designing a SoC, it is necessary to solve a contradictory requirement that a SoC having a large and complicated configuration needs to be developed in a short period of time at low cost.

Here, to meet the trend, in the system development, an architecture design needs to be conducted in an appropriate manner by performing an accurate analysis and abstraction of the system specification based on the requirements for a specification of the design target.

The first version of UML was adopted as a standard of OMG (Object Management Group) in 1997. UML is a design method including an abstraction of the design target, a visualization, a specification determination, and a drafting of documents related to the design. UML can be applied to a design not only for software and hardware but also a system (for instance, a business process) in the highest up-stream process. UML gains characteristics that can be dealt with even for a complicated system in a relatively simple way by handling an abstracted system. Realization of an architecture design which pursues optimum design parameters is under way by applying afore-mentioned UML to a SoC.

For example, "XModelink" is available, which is the only product on the market provided by CATS CO., LTD., as a tool applicable to a SoC design based on UML. This tool provides a frame work which automatically generates SystemC codes out of a UML model and confirms the specification by executing SystemC simulator.

However, though "XModelink" can provide a bridge to a system design taking implementation into consideration, "XModelink" does not possess a function that supports an architecture design by generating an evaluation model from a UML model.

Under the circumstances, a performance evaluation model generation device is needed. With such a device, a performance evaluation model of a design target can be automatically generated using a UML model (for instance, refer to the patent document 1, Japanese Patent Laid-Open 2001-318812). The performance evaluation model generation device consists of a UML model analysis unit, a performance evaluation model generation unit, and a performance model storage unit in which a performance evaluation model is stored. Here, the performance evaluation model is generated by the performance evaluation model generation unit. The performance evaluation model generation device analyses an inputted UML model at the UML model analysis unit; the device generates a performance evaluation model using the result of the analysis at the UML model analysis unit; and the device stores in record the performance evaluation model generated at the performance evaluation model generation unit. Consequently, it is possible to automatically generate a performance evaluation model for a system of the design target and thus a performance evaluation model can be generated easily every time when a system is in a design process.

[Patent Document 1]

Japanese Patent Laid-Open 2001-318812

The performance evaluation model generation device automatically generates a performance evaluation model based on a UML model, and stores performance evaluation results. However, a presentation of the performance evaluation results on a display is performed using a tool for performance evaluation sitting outside of the evaluation tool without having any relations with the performance evaluation model generation device. Therefore, it is not always possible to perform an architecture design pursuing optimum design parameters on the basis of viewing the whole system including both hardware and software.

SUMMARY OF THE INVENTION

An object of the present invention is to provide a UML design method which can facilitate an architecture design pursuing optimum design parameters on the basis of viewing the whole system including both hardware and software. The UML model design method performs a design by modeling a target system based on UML, using a profile storing a design parameter. More specifically, a stereotype and a tagged value are stored in the profile as the design parameters; the stereotype and tagged value are, then, annotated to the UML model of the design target; further, the annotated stereotype and tagged value are associated to each class constituting the UML model; and the stereotype, the tagged value and the UML model, which are associated to each other, are presented on GUI (Graphical User Interface) display.

According to the UML design method, for example, the stereotype and tagged value, which are required for the SoC design, are associated to each class constituting the UML model, and the stereotype, the tagged value and each class constituting the UML model, which are associated to each other, are presented on GUI (Graphical User Interface) display. Therefore, It is possible to perform an architecture design pursuing for the optimum design parameters in view of the whole system based on the UML model.

According to an aspect of the present invention concerning system design, a stereotype and a tagged value are associated with each class of a UML model, on the UML model. The classes constituting the UML model and the associated stereotypes and tagged values are displayed on the GUI. This enables architecture design, in which optimal design parameters are pursued while viewing the overall target system on the UML model. Accordingly, it is possible to increase the precision and efficiency in the system design using UML.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF INVENTION

Figure 1:
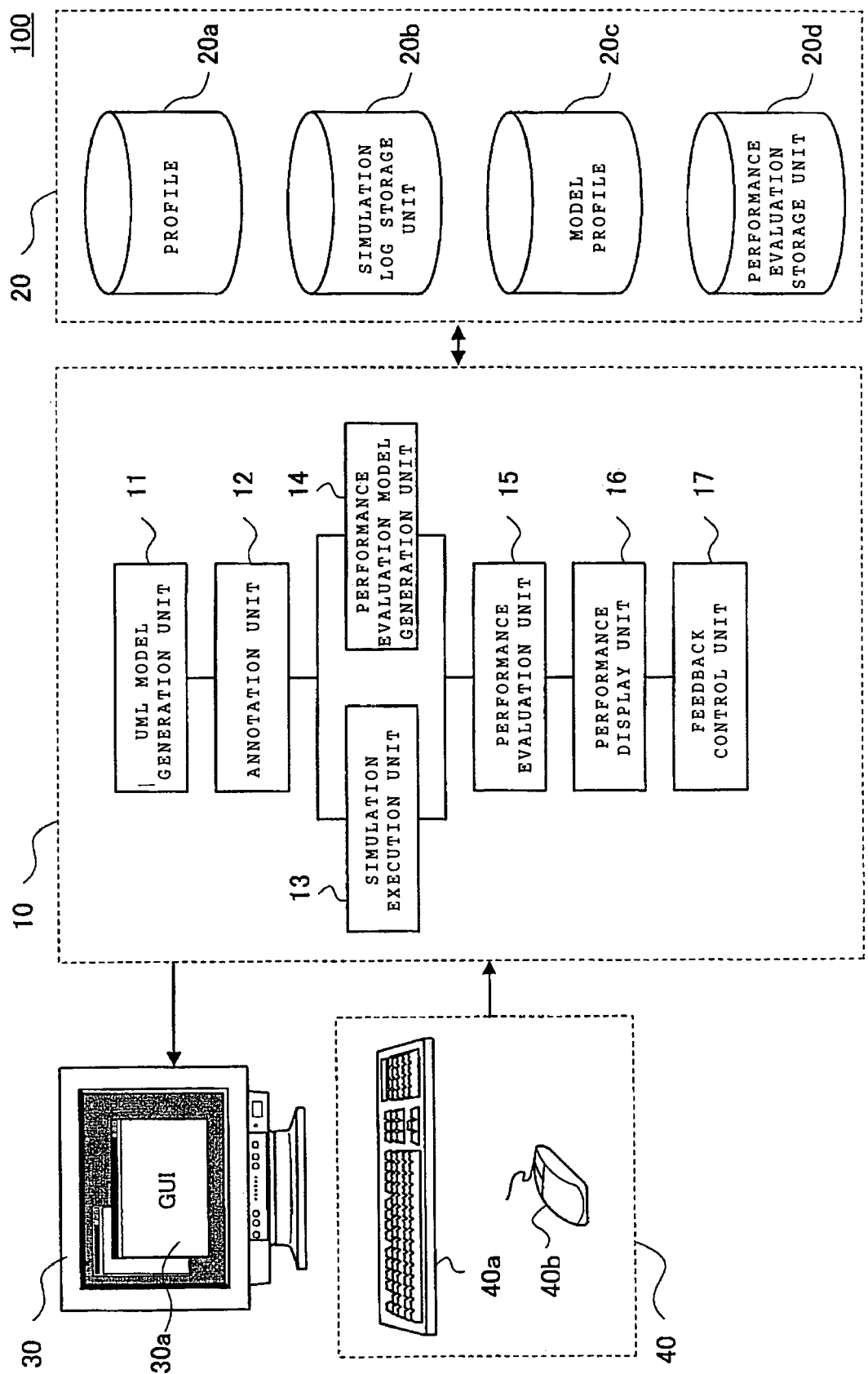
FIG. 1 is a block diagram showing a hardware configuration of a computer system for UML design.

The present invention provides a UML design method which can facilitate an architecture design in pursuit of optimum design parameters on the basis of viewing a whole system including both hardware and software.

Although "XModelink" can provide a bridge to a system design taking implementation into consideration, "XModelink" does not possess a function that supports an architecture design by generating an evaluation model from a UML model.

Under the circumstances, a performance evaluation model generation device is needed. With such a device, a performance evaluation model of a design target can be automatically generated using a UML model (for instance, refer to the patent document 1, Japanese Patent Laid-Open 2001-318812). The performance evaluation model generation device consists of a UML model analysis unit, a performance evaluation model generation unit, and a performance model storage unit in which a performance evaluation model is stored. Here, the performance evaluation model is generated by the performance evaluation model generation unit. The performance evaluation model generation device analyses an inputted UML model at the UML model analysis unit; the device generates a performance evaluation model using the result of the analysis at the UML model analysis unit; and the device stores in record the performance evaluation model generated at the performance evaluation model generation unit. Consequently, it is possible to automatically generate a performance evaluation model for a system of the design target and thus a performance evaluation model can be generated easily every time when a system is in a design process.

[Patent Document 1]

Japanese Patent Laid-Open 2001-318812

The performance evaluation model generation device automatically generates a performance evaluation model based on a UML model, and stores performance evaluation results. However, a presentation of the performance evaluation results on a display is performed using a tool for performance evaluation sitting outside of the evaluation tool without having any relations with the performance evaluation model generation device. Therefore, it is not always possible to perform an architecture design pursuing optimum design parameters on the basis of viewing the whole system including both hardware and software.

With the present invention, a UML model design method performs a design by modeling a target system based on UML, using a profile storing a design parameter. More specifically, a stereotype and a tagged value are stored in the profile as the design parameters; the stereotype and tagged value are, then, annotated to the UML model of the design target; further, the annotated stereotype and tagged value are associated to each class constituting the UML model; and the stereotype, the tagged value and the UML model, which are associated to each other, are presented on GUI (Graphical User Interface) display.

According to the UML design method, for example, the stereotype and tagged value, which are required for the SoC design, are associated to each class constituting the UML model, and the stereotype, the tagged value and each class constituting the UML model, which are associated to each other, are presented on GUI (Graphical User Interface) display. Therefore, It is possible to perform an architecture design pursuing for the optimum design parameters in view of the whole system based on the UML model.

According to an example embodiment of the present invention in a system design, a stereotype and a tagged value are associated with each class of a UML model, on the UML model. The classes constituting the UML model and the associated stereotypes and tagged values are displayed on the GUI. This enables architecture design, in which optimal design parameters are pursued while viewing the overall target system on the UML model. Accordingly, it is possible to increase the precision and efficiency in the system design using UML.

Hereinafter, an embodiment, which is a UML design computer system, applied for a SoC development using the UML design method of the present invention will be explained based on the accompanying drawings. Here, for instance, a SoC is a protocol converter which receives a signal from a Fiber Channel (referred as FC, hereinafter) and transmits to a serial AT architect (referred as SATA, hereinafter) after converting the signal appropriately.

(Hardware Configuration of the UML Design Computer System)

As shown in FIG. 1, the UML design computer system 100 includes a control circuit 10, which involves a CPU, a RAM, and a ROM. The computer system 100 also includes a storage device 20, a display 30 and input devices 40, each of which is connected to the control circuit 10.

The storage device 20, which are configured with a hard disk, constitutes of a profile 20*a*, a simulation log storage unit 20*b*, a model profile 20*c*, and a performance evaluation storage unit 20*d*. The storage device 20 is connected to the control circuit 10 via a predetermined interface and can communicate with the control circuit 10 in dual directions.

A profile is defined by a RT-UML storing parameters relating to time constraint and resource constraint of a UML model. However, the profile which is required in a specific matter region such as a design of a SoC is not defined in the RT-UML. To deal with this problem, it is necessary to prepare a profile to be defined in this specific matter region. The profile stores the stereotype and tagged value which are specific parameters relating to time constraint and resource constraint defined for this specific matter region.

The display 30 consists of display devices such as a CRT or a LED. The display 30 is connected to the control circuit 10 via a predetermined interface, and performs a screen display depending on the signal transmitted from the control circuit 10.

The input devices 40 consist of a key board 40*a* and a mouse 40*b*. A performance index which is presented on a performance display GUI 30*a* is changed in accordance with a transition of a mouse pointer caused by the user through operations of a key board 40*a* and/or a mouse 40*b*. An indication of re-calculation relating to a performance evaluation based on the changed performance index is inputted to the control circuit 10. The input devices 40 are connected to the control circuit 10 via a predetermined interface, and transmit a predetermined signal to the control circuit 10.

The control circuit 10 consists of a UML model generation unit 11, an annotation unit 12, a simulation execution unit 13, a performance evaluation model generation unit 14, a performance evaluation unit 15, a performance display unit 16, and a feedback control unit 17.

The UML model generation unit 11 conceptually generates an object using each configuration element of the SoC (for example, a CPU, a memory, a bus, hardware such as a peripheral device and the like, and software such as various sorts of protocol engines and the like). The UML model generation unit 11 subsequently generates a UML class map. The map shows each object in addition with the relationships among the objects.

The annotation unit 12 gives an annotation to each object, which is included in the UML class map generated by the UML model generation unit 11. The annotations are given using read out parameters. Thereafter, the SoC design will be made based on the parameters which concern to the time and resource constraints.

It is to be noted that the design of SoC requires stereotypes and tagged values which represent hardware resources such as a clock, a width of bus, a memory size, a buffer size, process latency, and a priority.

The simulation execution unit 13 generates executable codes such as C++ and SystemC based on an annotated class map. The action of SoC is simulated by executing the executable codes. A result of the simulation is stored in the simulation log storage unit 20b.

The performance evaluation model generation unit 14 acquires performance indexes of each major configuration element (referred as a performance index, hereinafter) by analyzing the UML class map and stores the performance indexes in the model profile 20c. Thereafter, the performance evaluation model generation unit 14 generates a performance evaluation model based on the performance indexes.

It is to be noted that both of the simulation execution unit 13 and the performance evaluation model generation unit 14 carry out a performance evaluation of the SoC. There is a difference between the two: the simulation execution unit 13 performs a performance evaluation based on a simulation; on the other hand, the performance evaluation model generation unit 14 performs a performance evaluation based on a model.

The performance evaluation unit 15 calculates a performance evaluation of the entire SoC (referred as a performance evaluation, hereinafter) on the basis of the simulation result obtained at the simulation execution unit 13 and performance evaluation model generated at the performance evaluation model generation unit 14. The performance evaluation obtained and performance index of each configuration element of the SoC are stored in record in the performance evaluation storage unit 20d. Note that the performance evaluation based on the result of simulation is acquired from the simulation log which is stored in record in the simulation log storage unit 20b. Moreover, the performance evaluation based on the performance evaluation model is acquired as an output obtained after driving the performance evaluation model.

The performance display unit 16 starts up the performance display GUI 30a. This performance display GUI 30a presents on the display the performance index and performance evaluation both stored in record in the performance evaluation storage unit 20d. This performance index contains, for instance, an occupied rate and contention of the bus, a Read/Write speed of the memory, a rate of use and a throughput of the cash and the processor, a chip size, power consumption and the like.

When a command for re-calculation of the performance evaluation based on a changed performance index is inputted to the feedback control unit 17 through the transition of a mouse point caused by a operation with a key board 40a and a mouse 40b by the user, the feedback control unit 17 writes the changed performance index into the profile 20a and updates the performance index which has already written into the profile 20a. The changed performance index is used to annotate each object included in the UML class map at the annotation unit 12. In accordance with the annotation, a performance evaluation is obtained through the subsequent processes at the simulation execution unit 13, the performance evaluation model generation unit 14, and the performance evaluation unit 15. The performance evaluation, which is presented on the performance display GUI 30a, is up-dated.

[Control Circuit Operation of UML Design Computer System]

Figure 2:
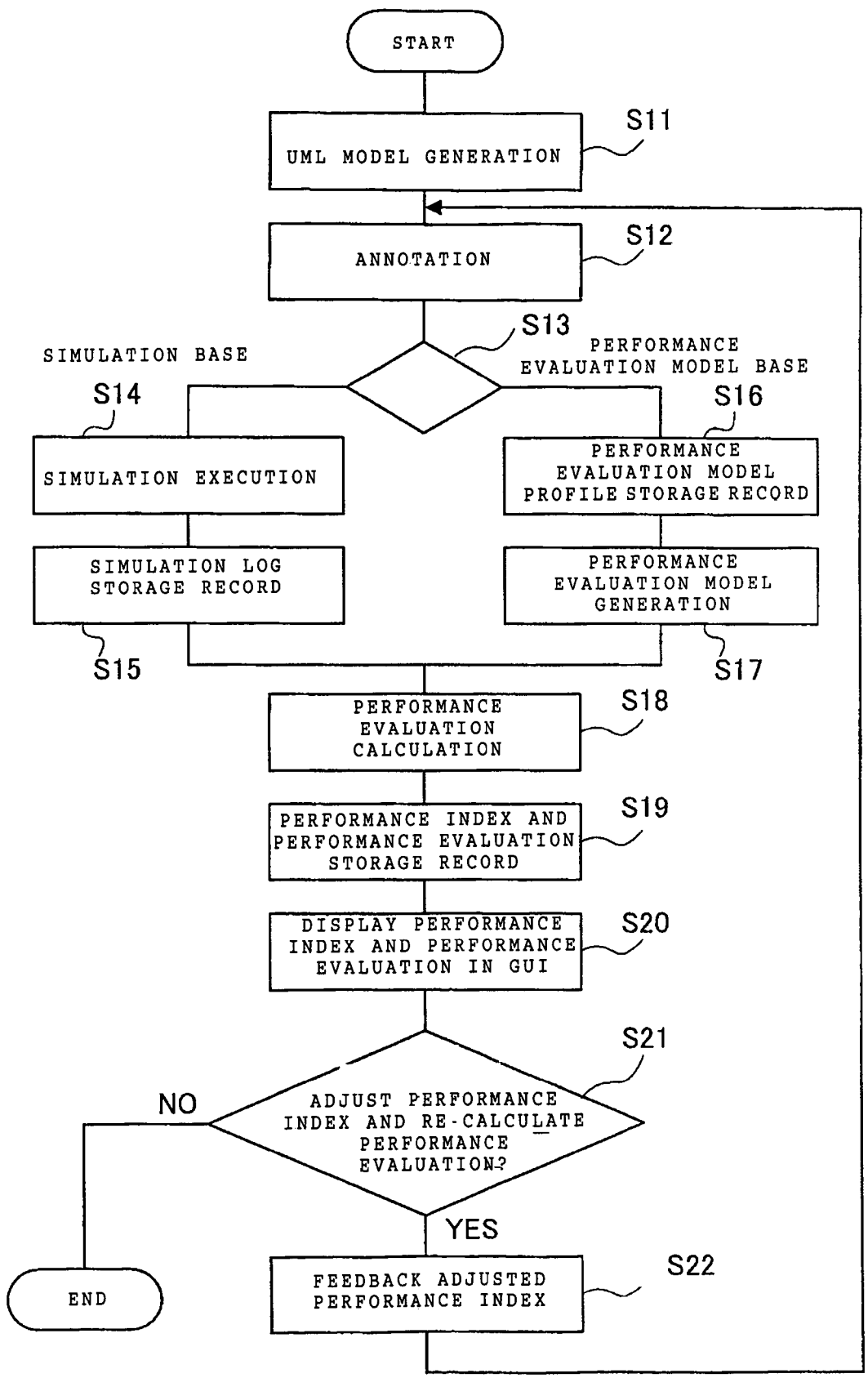
FIG. 2 is a flowchart showing operation steps of a control circuit in the computer system for UML design.

Referring to FIG. 2, operation of the Control circuit 10 of the UML design computer system is explained.

First, the UML model generation unit 11 of the control circuit 10 conceptually generates an object for each configuration element of the SoC, and generates a UML class map which shows each object with relationships between the objects (Step S11).

Further, the annotation unit 12 of the control circuit 10 annotates each object included in the UML class map generated by the UML model generation unit 11 using major non-functional elements read out from the profile 20a, such as time constraint and resource constraint which are stored in the profile 20a and required for the design of the SoC (Step S12).

Still further, the control circuit 10 determines a choice of the user as for the method of conducting performance evaluation (Step S13). Here, the choice will be made between the performance evaluation by simulation (simulation basis) and the performance evaluation using a performance evaluation model (performance evaluation model basis). If the simulation basis is judged to be chosen, the flow moves to Step S14. On the other hand, if the performance evaluation model basis is judged to be chosen, then the flow moves to Step S16.

In Step S14, the simulation execution unit 13 generates executable codes based on the annotated class map, and by executing the codes the unit 13 simulates an operation of the SoC. Thereafter, the result of the simulation is stored in record in the simulation log storage unit 20b (Step S15).

In the mean time, in Step S16, the performance evaluation model generation unit 14 of the control circuit 10 acquires a performance index of each configuration element of the SoC by analyzing the UML class map, and stores the performance index in record in the model profile 20c. Then, performance evaluation model generation unit 14 generates a performance evaluation model based on the performance index (Step S17).

Further, the performance evaluation unit 15 of the control circuit 10 calculates performance evaluation of each configuration element of the SoC and the entire SoC, using the simulation result obtained at the simulation execution unit 13 or using the performance evaluation model generated at the performance evaluation model generation unit 14 (Step S18). As for the performance evaluation based on the result of simulation, the occupied rate of the bus, for instance, is obtained by adding up all of the time used for transfers in the bus master (a configuration element for transferring information using the bus among the SoC configuration elements) stored in the simulation log storage unit 20b, and then dividing the time thus added up by the simulation time. Moreover, as for the performance evaluation of the SoC based on the performance evaluation model, the performance evaluation, for instance, is generated by applying a probabilistic model such as a Markov process to each performance index which is stored in the model profile 20c, and then, by adding the obtained results linearly.

Next, the performance evaluation is stored in record in the performance evaluation storage unit 20d with the performance index of each configuration element of the SoC (Step S19).

Next, the performance display unit 16 of the control circuit 10 presents the performance index and the performance evaluation stored in record in the performance evaluation storage unit 20d, on the performance display GUI 30a (Step S20).

Next, the control circuit 10 determines whether a command for a re-calculation of performance evaluation based on the changed performance index is inputted or not, in accordance with a transition of a mouse pointer caused by a user through operations of a key board 40a and/or a mouse 40b (Step S21). If the determination is "YES", the flow moves to Step S22. On the other hand, if the determination is "NO", the process flow ends.

Next, in Step S22, the feedback control unit 17 of the control circuit 10 updates the performance index to be stored in the profile 20a with the changed performance index. After the completion of this process, the flow moves to the process in Step S12.

(Use Example: Stereotypes and Tagged Values of the RT-UML)

Figure 3:
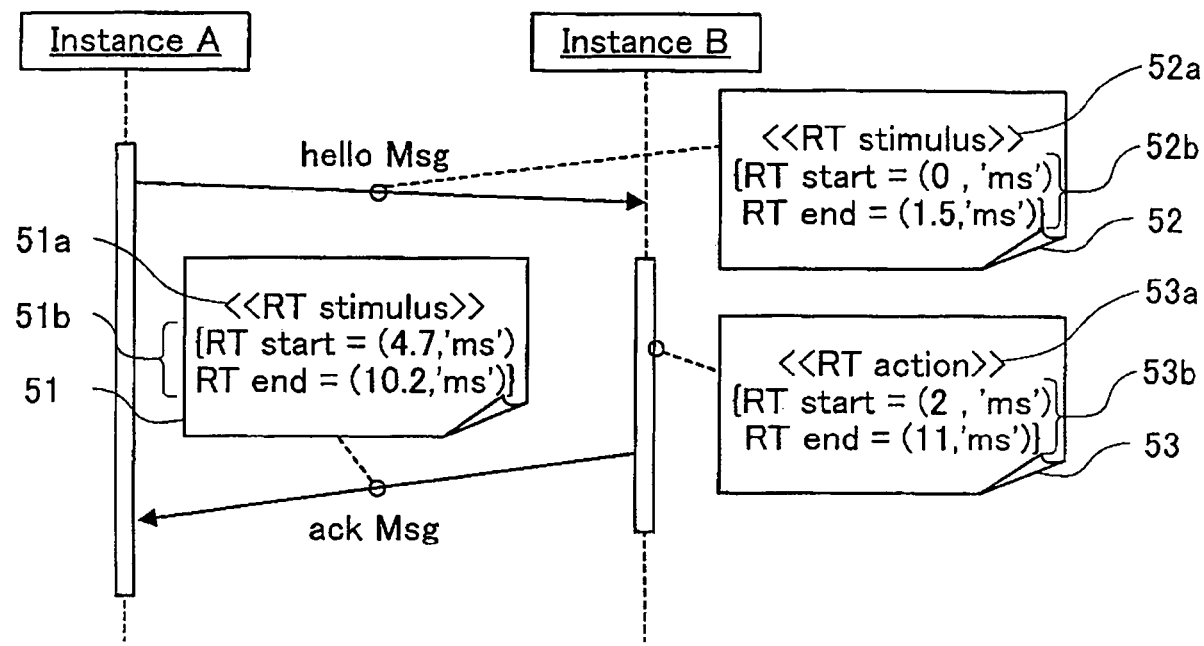
FIG. 3 is a diagram showing an example of use of stereotypes and tagged values in RT-UML.

FIG. 3 is a chart showing a use example of stereotypes and tagged values of the RT-UML.

The user can perform development of built-in, real-time, network systems using UML. The systems in this application field require features such as event-driven, parallel processing, and distribution processing. Furthermore, the systems need to clear strict conditions relating to latency time in processing, throughput, and reliability. The RT-UML provides, in its profile, major factors required for a system design in these application fields using UML.

However, for a specific matter region, since there are some major non-functional elements exited in the above RT-UML, the RT-UML provides a function with which unique stereotypes and tagged values for the specific matter region are defined in the profile.

For instance, in the design of an SoC, the stereotypes and tagged values representing hardware resources such as, a clock-rate, a width of the bus, a memory size, a buffer size, latency time in processing, a priority are necessitated. The stereotypes and tagged values required for generation of a UML model which is domain unique, and interpretations thereof are described in the profile.

In FIG. 3 the profiles 51, 52, 53 are illustrated. In each profile, the stereotype 51a and the tagged value 51b, the stereotype 52a and the tagged value 52b, and the stereotype 53a and the tagged value 53b are described.

The example in FIG. 3 shows communications between the Instance A and Instance B. The Instance A transmits "a hello Msg" (Hello Message) to Instance B till the completion of the transmission, that is, during zero millisecond time and 1.5 millisecond time, in accordance with the <<RT stimulus>> stereotype 52a and the tagged values 52b of the profile 52. Accordingly, Instance B transmits an "ackMsg" (acknowledge Message) to Instance A, during 2 millisecond time and 11 millisecond time, in accordance with the <<RT action>> stereotype 53a and the tagged values 53b of the profile 53. Further more, Instance B transmits an "lack Msg" (acknowledge Message) to Instance A till the completion of the transmission, that is, during 4.7 millisecond time and 10.2 millisecond time, in accordance with the <<RT stimulus>> stereotype 51a and the tagged values 51b of the profile 51.

(Class Map of Modes of a SoC (for Instance, a Protocol Converter) in UML)

Figure 4:
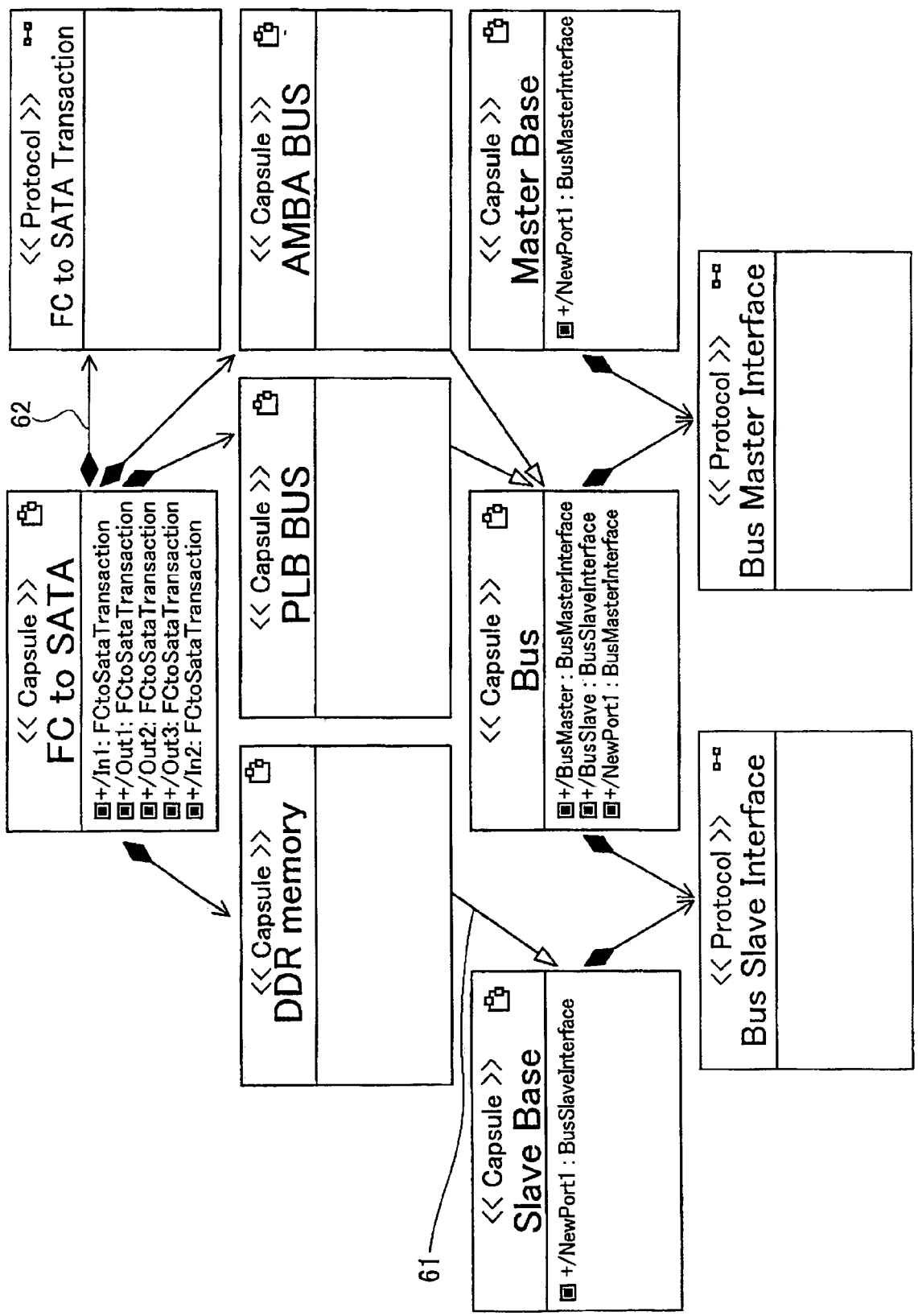
FIG. 4 is a class map showing an upper and lower relationship of each class of node of a SoC (for example, a protocol converter) in UML.

FIG. 4 is a class map showing an upper and lower relationship of each class of node of a SoC (for example, a protocol converter) in UML.

FIG. 4 shows classes which belong to central classes among the classes in a SoC (for instance, a protocol converter). The central classes can be a node and referred as a capsule. In FIG. 4 there are classes indicated as a <<Capsule>> and a <<Protocol>>.

The arrow 61 in FIG. 4 indicates "derivation". Derivation is a concept that a subclass is derived from a class. The derivation is indicated by an arrow pointing a parent class from a subclass, and means that the subclass is derived from the parent class.

The arrow 62 in FIG. 4 indicates a composition between classes with the same life-time. The composition is a concept indicating a relationship between the entity and a part. The same life-time indicates that a part of classes will vanish in accord with the end of life-time of the entity. The composition is indicated by an arrow pointing classes in a part from classes in the entity. The direction of the arrow indicates that subclasses are a part of the parent class. The arrow 62 in FIG. 4, for example, shows that "FC to SATA" is a class in the entity and "FC to SATA Transaction" is a class in a part.

Incidentally, in FIG. 4, in a case of designing a SoC (for example, a protocol converter) using the UML computer system of the present invention, "PLS BUS" and "AMBA BUS" are selectable. Either one is selected and presented on display.

(Class Map Showing the Detailed Configuration of "Master-Base" Class)

Figure 5:
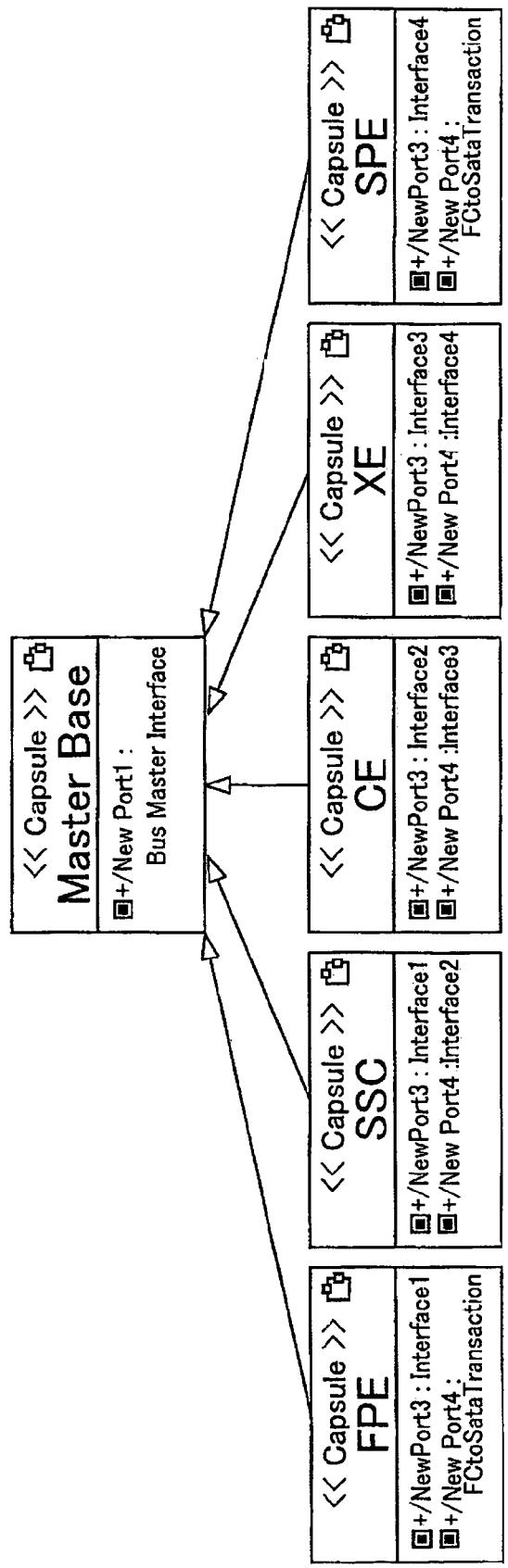
FIG. 5 is a class map showing a detailed configuration of a "Master Base" class.

FIG. 5 shows the detailed configuration of "Master Base" class shown in FIG. 4.

According to FIG. 5, it can be understood that the "Master Base", in a whole, derives classes such as, FPE (Fiber Channel Protocol Engine), SSC (Sector Size Converter), CE (Compression Engine), XE (XOR Engine), SPE (SATA Protocol Engine).

(Class Map Showing Association Relationships of Each Class of the SoC in UML)

Figure 6:
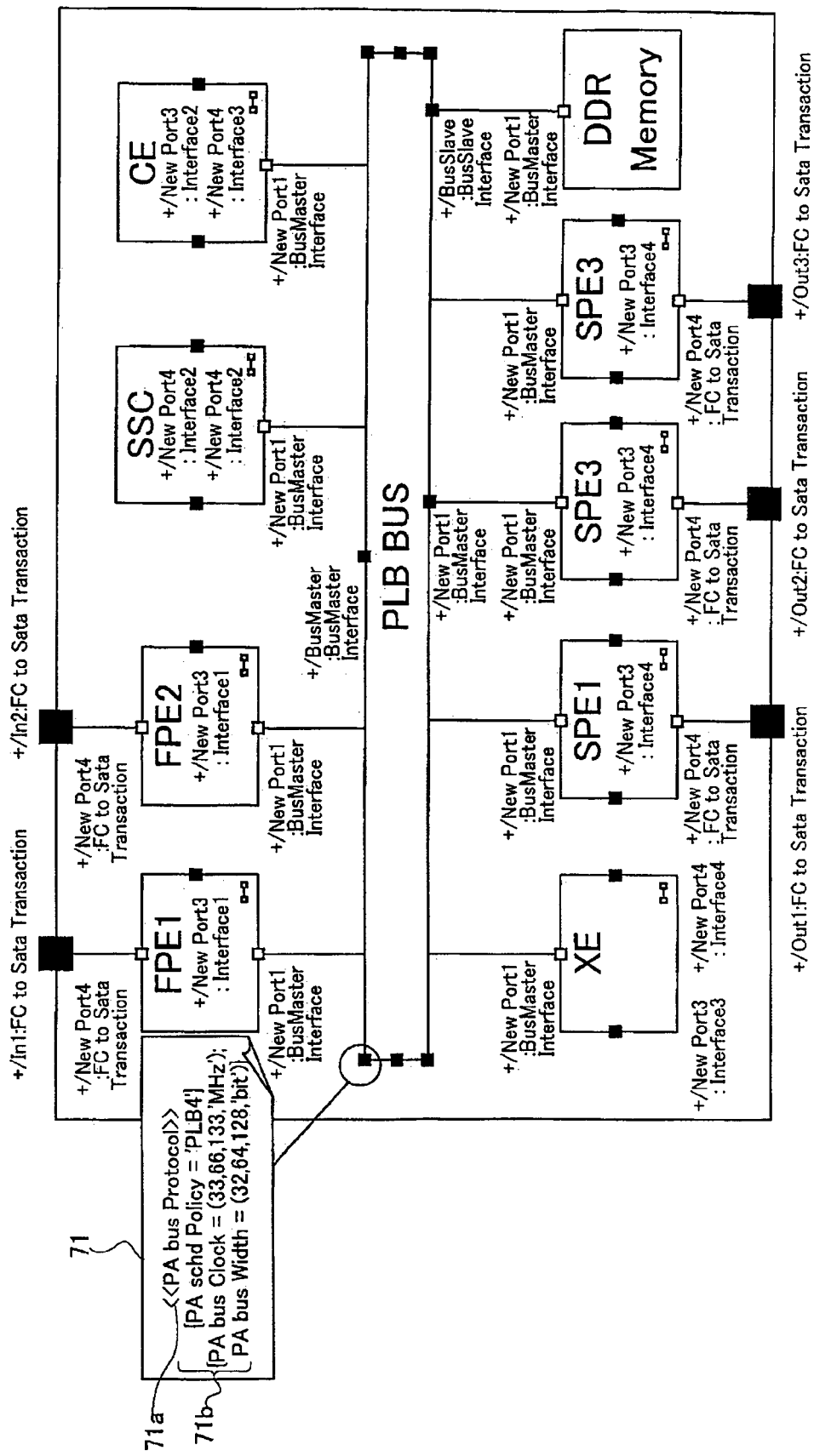
FIG. 6 is a class map showing an association relationship of each class of node of a SoC (for example, a protocol converter) in UML.

FIG. 6 is a class map showing association relationships of each class of node in the design of a SoC (for instance, a protocol converter) using UML. FIG. 6 shows the class map of a SoC (for instance, a protocol converter) from a different view point, apart from the one, which is a class map of nodes, in FIG. 4. FIG. 6 is showing association relationships of each class of node in the design of a SoC (for instance, a protocol converter) using UML.

In a profile 71, the stereotype 71a and the tagged values 71b of "PLUS BUS" are stored.

(Sequence Chart of a SoC (For Instance, a Protocol Converter) Using UML)

Figure 7:
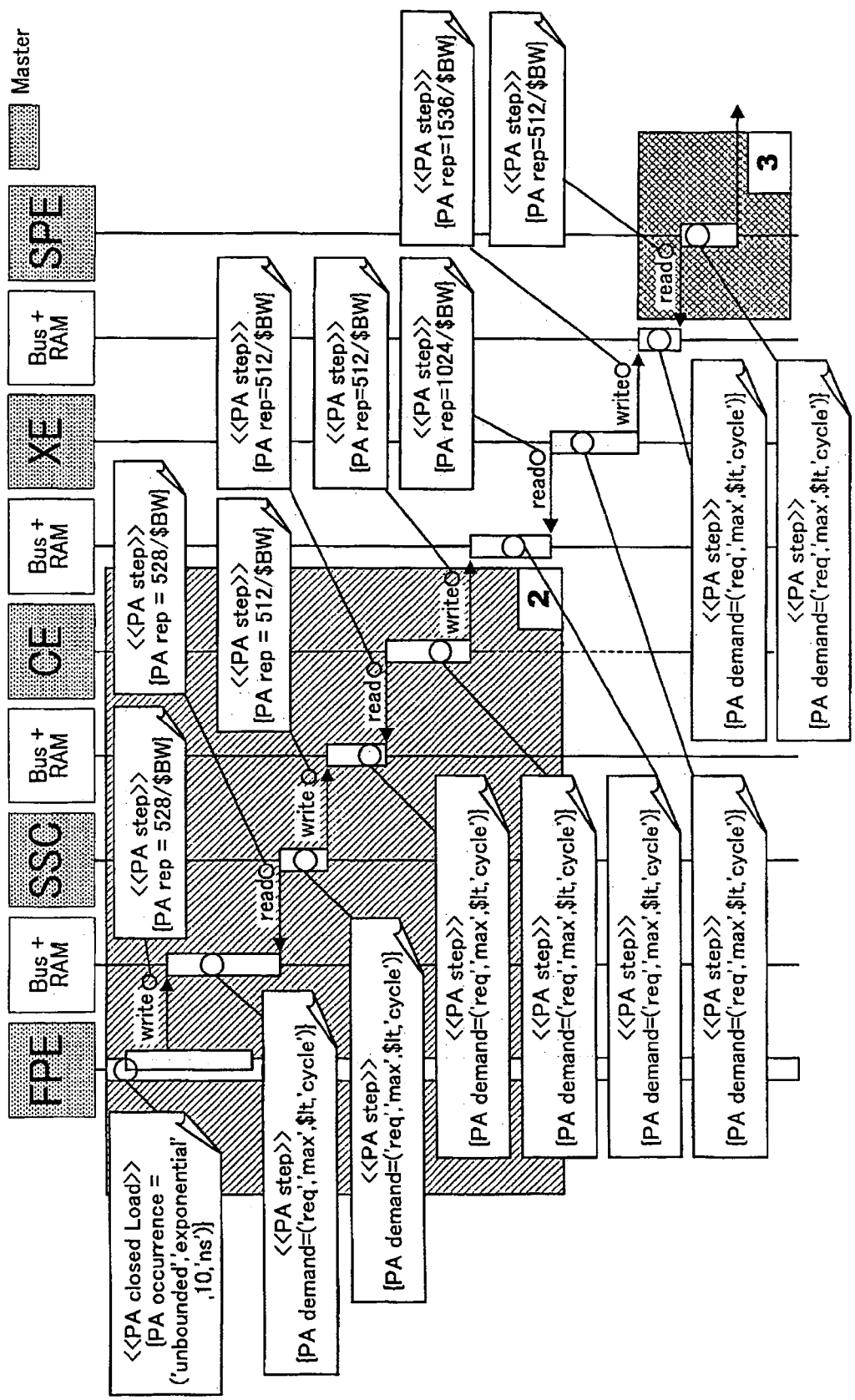
FIG. 7 is a sequence chart in time series showing interactions of each class of node in the design of SoC (for instance, protocol converter) using UML.

FIG. 7 is a sequence chart in time series showing interactions of each class of node in the design of a SoC (for instance, a protocol converter) using UML.

The sequence chart in FIG. 7 is a schematic view showing dynamic relationships of a SoC (for instance, a protocol converter). All the classes and "Read/Write" inputs and outputs indicated in each arrow are tied to an execution of a performance evaluation simulation and a generation of a performance evaluation model. Each oblong rectangle to which a start point and an end point of an arrow are connected at the "Read/Write" input and output points indicated by an arrow, is arranged along a time series in relation with an actual operation sequence of each class. The upper part in the chart represents time in advance relatively. Each class conducts "Read" or "Write" operation indicated nearby the area, in the arrowed direction towards "Bus+RAM". In each oblong rectangle, a stereotype and a tagged value to be stored in the profile are annotated. Moreover, each rectangle meshed with slanted lines in FIG. 7 indicates that, in the area, the actual operation sequence described herein before of each class included in the rectangle will be repeated. A value shown below in the right of the rectangle represents the number of the repetition. On the basis of the operation of each class following the sequence chart, execution of a performance evaluation simulation and generation of a performance evaluation model are conducted, and thus, it is possible to obtain a performance evaluation of a SoC (for instance, a protocol converter).

(Image Showing a Method of Selection to Select a Class to be Presented on a Performance Display GUI 30a From the Class Map in UML)

Figure 8:
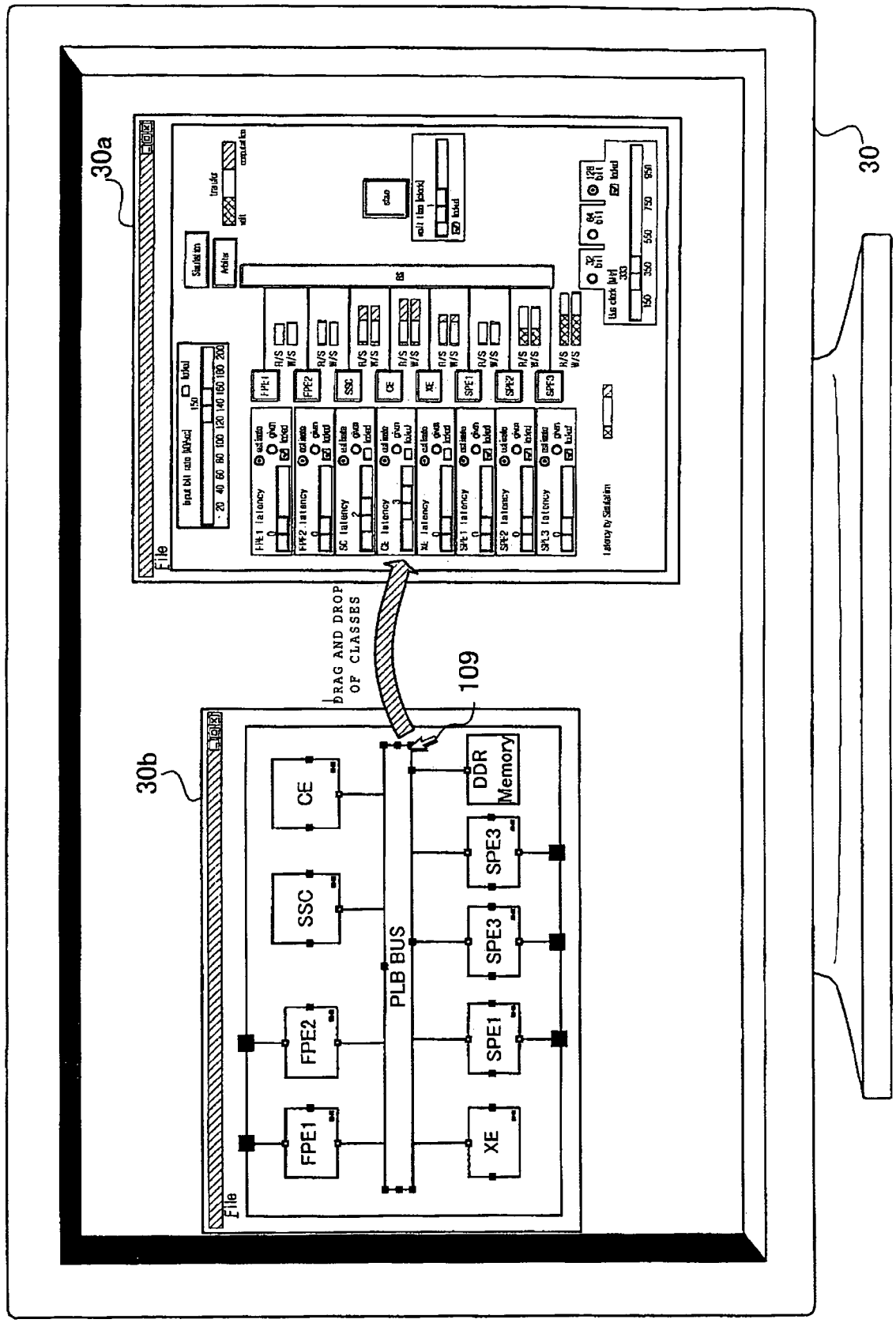
FIG. 8 is an image showing a method of class selection to select a map to be presented on a performance display GUI 30*a*, from the class map for a SoC (for example, a protocol converter) in UML, the performance display GUI 30*a* displaying performance indexes and performance evaluations.

FIG. 8 is an image showing a method of class selection to select a map to be presented on a performance display GUI 30a, from the class map for a SoC (for example, a protocol converter) in UML, the performance display GUI 30a displaying performance indexes and performance evaluations.

Figure 9:
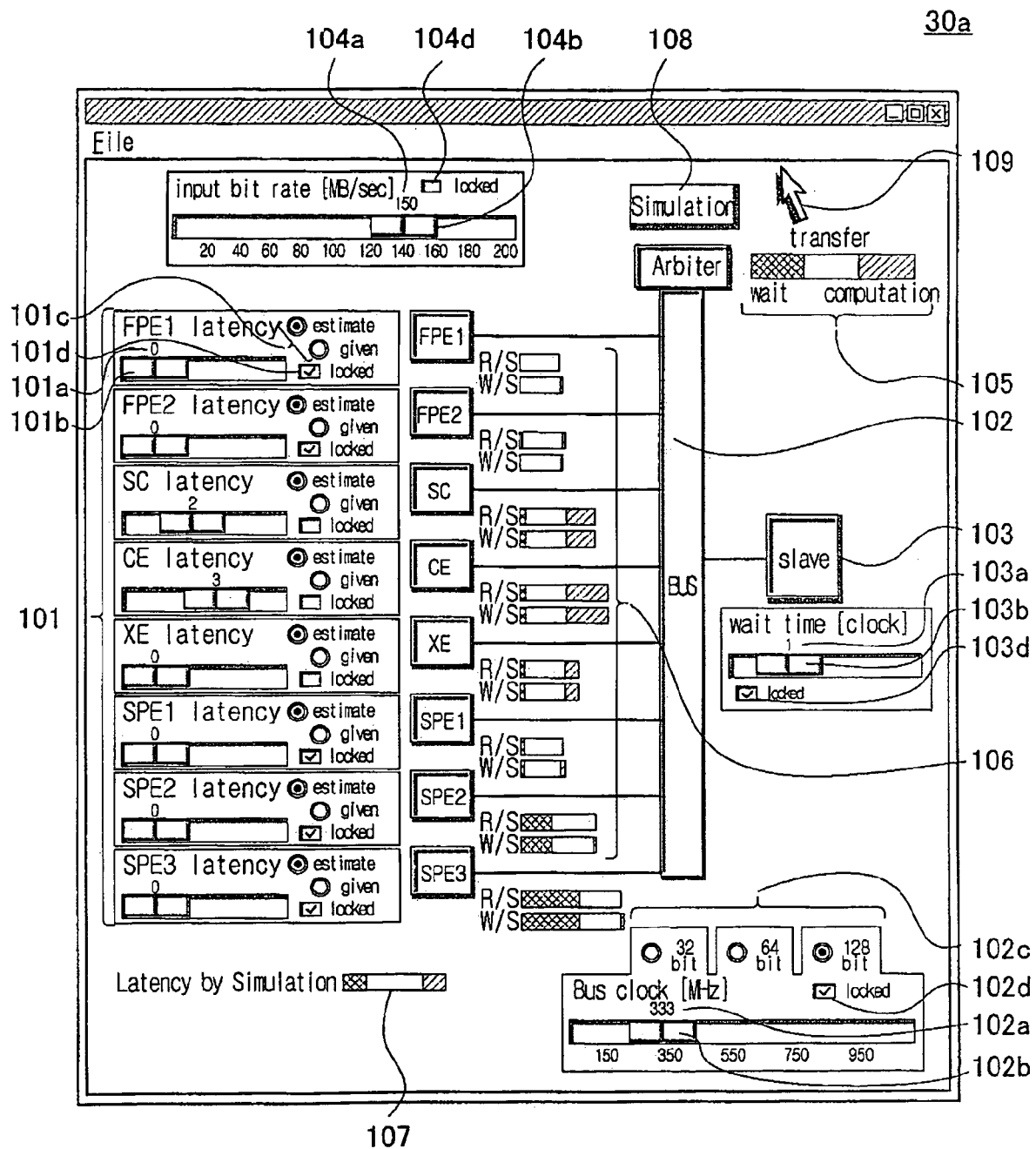
FIG. 9 shows an image on a performance display GUI 30*a*, which displays performance index and performance evaluation.

Referring to FIG. 8, it can be observed that there are two images being presented in parallel, that is, a display 30b presenting an image of FIG. 6 and a performance display GUI 30a of FIG. 9. The user selects an arbitrary class from the display 30b through the operation of a mouse 40b (Refer to FIG. 1) by moving the mouse pointer and clicking for selection. Then, the user can present the selected class on the performance display 30a by a drag and drop thereof. Accordingly, when a class is selected to be presented on the performance display 30a, an input display of the performance indexes of the selected class and output display of the performance evaluation based on the performance indexes are presented on the performance display 30a as it is shown in FIG. 9 to be explained thereafter.

It is to be noted that when a class is arranged in the performance display GUI 30a, the performance display unit 16 (refer to FIG. 1) acquires the performance indexes of those classes and the performance evaluation of the whole system configuring with those classes by referring to the performance evaluation storage unit 20d (refer to FIG. 1), and then presents those on the performance display GUI 30a. Thereafter, if no changes on the sort and configuration of the class are applied, there is no need to access again the performance evaluation storage unit 20d. The architecture design proceeds, as follows, changing of performance indexes using the performance display GUI 30a, acquiring and outputting performance evaluations, and presenting again and confirming the performance evaluation on the performance display GUI 30a.

(Image Chart of the Performance Display GUI 30a)

FIG. 9 is an image on a performance display GUI 30a. Note that though FIG. 9 is a display image of the performance display GUI 30a in the case of conducting performance evaluation of the SoC by simulation, a similar display will be obtained in a performance evaluation of the SoC conducted based on the performance evaluation model basis.

Each of the classes, which are selected from the class map shown in FIG. 5 and dragged and dropped to the performance display GUI 30a using the way shown in FIG. 8, is arranged as shown in FIG. 9 so that each of them forms a function block 101, a bus 102, or a memory 103. The function block 101, the bus 102, and the memory 103 display a corresponding performance index of each class. The function block 101 includes FC1, SC, CE, XOR, SATA1, SATA2, and SATA3.

First, an input display of performance indexes on the performance display GUI 30a is explained.

With respect to each of the function blocks 101, a latency of FC1, for instance, is shown in the area of input display 101a. The value thereof can be adjusted by operating the slider control 101b. Sliding of the slider control 101b can be adjusted within a certain predetermined range. The latency of FC1 in the function block 101 can be set arbitrarily, by the user as an estimated value, a given value, and a locked value using a radio button 101c or a check box 101d. Incidentally, as for the FC1 block, the same is for the latency of other function blocks.

A bus clock of the bus 102 is shown in the area of input display 102a. The value thereof can be adjusted by operating the slider control 102b. Sliding of the slider control 102b can be adjusted within a certain predetermined range. The user can set the bus clock of the bus 102 on his/her own will, in regard to whether or not it is locked to a locked value with a check box 102d. Incidentally, the width of the bus can be set arbitrarily by the user using a radio button 102c.

A wait time of the memory 103 is shown in the area of input display 103a. The value thereof can be adjusted by operating the slider control 103b. Sliding of the slider control 102b can be adjusted within a certain predetermined range. The user can set the wait time of memory 103 on his/her own will, in regard to whether or not it is locked to a locked value with a check box 102d.

A designation of input data rate to a SoC (for instance, a protocol converter) is shown in the area of input display 104a. The value thereof can be adjusted by operating the slider control 104b. Sliding of the slider control 104b can be adjusted within a certain predetermined range. The user can set the input data rate on his/her own will, in regard to whether or not it is locked to a locked value by a check box 104d.

Next, an output display of performance evaluation on the performance display GUI 30a is described.

The legend display 105 shows a legend of output display of the performance evaluation on the performance display GUI 30a. For example, an indicator at the right side of R/S and W/S in the area of output display 106 shows a latency of each function block in 101. A length in lateral direction indicates the absolute value of each latency. Here, the latency is a sort of performance indexes. The breakdown of the latency0, as the legend display 105 indicates, from right, wait time, transfer time, and calculation time. In addition, a length in lateral direction indicates the absolute value of each time. By presenting graphically in an indicator, it is possible to intuitively grasp the latency time for each block with ease of understanding.

The performance evaluation output display 107 shows the latency as performance evaluation for the entire SoC (for instance, a protocol converter) on the basis of each performance index which is set at each function block 101, a bus 102, and a memory 103 and presented on the performance display 30a.

If the re-calculation button 108 is depressed, after each performance index is changed by manipulating each respective slider, the feedback control unit 17 (refer to FIG. 1) updates the tagged values in the profile based on the changed performance indexes. Subsequently, the annotation unit 12, the simulation execution unit 13 or the performance evaluation model generation unit 14, the performance evaluation unit 15, and the performance display unit 16 (refer to FIG. 1 for either unit) start to operate sequentially, and performance evaluation will be re-calculated based on the tagged values which have been changed.

Note that, the mouse pointer 109 is presented on the performance display GUI 30*a*. The user can perform an operation over each slider control, each radio button, each check box, and re-calculation button 108, by operating the mouse 40*b* to move the mouse pointer 109 and click thereof.

Moreover, in the case of presenting the performance evaluation on the performance display GUI 30*a*, based on the performance evaluation basis, the performance evaluation will be presented based on each performance index which has been changed without depressing the re-calculation button, when a change is made to each performance index with each slider control only. However, when the change of each performance index is originated in changes in the function blocks and the configuration thereof, the performance evaluation will be updated, based on each performance index which has been changed, by pressing down the re-calculation button 108. It is to be noted that, in the case of presenting the performance evaluation based on the performance evaluation model basis on the performance display GUI 30*a*, the presentation of R/S, W/S, "Latency by Simulation" on the performance display GUI 30*a* will be altered to R/M, W/M, "Latency by Model" respectively.

Note that, it is also possible to facilitate a function for comparison between the latest result of performance evaluation and the past results of performance evaluation by storing performance indexes and evaluations by the performance evaluation model and the results of simulation. By doing so, there may be cases that architecture designs pursuing optimum parameters be performed efficiently on the basis of viewing the whole system including hardware and software.

According to the UML design method of the present invention, every process, from a requirement analysis and a system analysis based on the requirement analysis till an architecture design as a whole, can be conducted using the UML model.

Moreover, on the performance display GUI 30*a*, it is possible to examine which function in the function block 101 would be playing a dominant role in the whole performance evaluation of a SoC (for instance, a protocol converter) in terms of latency, by observing the output display 106 corresponding to each function block in consideration of the content in display in the performance evaluation output display 107. Having this feature in GUI 30*a*, each function in the function block 101 may be efficiently separated into partitions (conducts of partitioning) in terms of functional implementation by hardware and by software.

These days, there are few systems working only in hardware basis. Ordinarily, many systems are working under hardware and software based implementations in harmony. On the basis of the UML modeling, each hardware and software part can be described in the same notation and thus a seamless design can be achieved. By using the UML design method of the present invention, a search for the architecture can be executed starting from a model, whose level of abstraction is high without separating hardware and software implementations neither specifying details of the architecture of the model. In steps in the middle, there may be cases observed that partitioning between the functions to be implemented by hardware and by software be performed easily.

In the UML modeling, there are UML profiles ready for use. Furthermore, for a specific matter region, there is a method provided for extending the profiles for the region. For example, by using stereotypes it is possible to modify model elements with differences in a role and a use, and it is also possible to add non-functional matters represented by time constraints and resource constrains to the model elements by using tagged values. The UML modeling can be regarded as a highly extensible modeling, since the modeling is providing a framework in which unique model elements and constrains can be defined by the user.

In an example of an ASIC design, it is said to be necessary to specify a detailed description in an implementation level in order to clarify various factors influencing at the designing stage on the entire latency of the processing. The factors include a priority of bus occupancy of the master unit, a buffer size to absorb the difference in latency of the processing units, and deterioration of compression factors in the data compression unit. Therefore, it is often the case that the influences can only be revealed at the well advanced stage in designing. However, the UML design method of the present invention has provided means for specifying the influences of latency quantitatively at the initial stage of the design.

According to the embodiments described hereinbefore, it is possible to realize a UML design computer system, a UML design method, and a computer readable recording media which record the design method, shown in each item below.

(1) A computer system which performs design by modeling a target system based on Unified Modeling Language (UML), using a profile storing a design parameter, the computer system includes: specific matter region profile setting means for setting the profile by storing in the profile a stereotype and a tagged value with respect to a specific matter region as design parameters; design parameter adding means for adding the design parameters included in the profile to the UML model of the target system; and GUI display means for associating the design parameters included in the profile with the UML model, and for displaying the design parameters and the UML model, which are associated with each other, on a graphical user interface (GUI).

(2) The computer system according to item (1), wherein the stereotype and tagged value are set by RT-UML (Real Time Unified Modeling Language).

(3) The computer system according to item (1), wherein the stereotype and tagged value include design parameters relating to time constraints for processing of the target system and resource constraints of the target system.

(4) The computer system according to item (1), the computer system includes: at least one of the following means, a first performance indexes acquiring means for acquiring performance indexes of the target system using a performance evaluation model to be generated based on the design parameters which are added to the UML model and a second performance indexes acquiring means for acquiring performance indexes of the target system using execution results of a simulation obtained by simulating the UML model based on the design parameters; and means for storing performance indexes in record for storing the acquired performance indexes.

(5) The computer system according to item (4), wherein the GUI display means displays visually and quantitatively performance of the target system, based on the selected performance indexes and the entire performance indexes, when the performance indexes required for an architecture design of the target system are selected from the means for storing performance indexes in record.

(6) The computer system according to item (5), wherein the GUI display means includes: a GUI element having a capability of changing the displayed performance indexes; and a feedback means for, when the performance indexes are changed by the GUI element, updating the design parameters stored in the profile, corresponding to the changed performance indexes.

(7) A UML design method for performing design by modeling a target system based on Unified Modeling Language (UML), using a profile storing a design parameter, the method includes the steps of: setting the profile by storing a stereo type and a tagged value in the profile as the design parameters, the stereo type and tagged value concerning a specific matter region; adding the design parameters to the UML model of the target system by using the profile; and associating the design parameters with the UML model by using the profile; and displaying the design parameters and the UML model, which are associated with, on a graphical user interface (GUI).

(8) The UML design method according to item (7), wherein the stereotype and tagged value are set by RT-UML (Real Time Unified Modeling Language).

(9) The UML design method according to item (7), wherein the stereotype and tagged value include design parameters relating to time constraints for processing of the target system and resource constraints of the target system.

(10) The UML design method according to item (7), the UML design method includes: at least one of the following steps, a first performance indexes acquiring step for acquiring performance indexes of the target system using a performance evaluation model to be generated based on the design parameters which are added to the UML model, and a second performance indexes acquiring step for acquiring performance indexes of the target system using execution results of a simulation by simulating the UML model based on the design parameters; and a step for storing performance indexes in record for storing the acquired performance indexes.

(11) The UML design method according to item (10), wherein the GUI display means displays visually and quantitatively performance of the target system, based on the selected performance indexes and the entire performance indexes, when the stored performance indexes in record required for an architecture design of the target system are selected.

(12) The UML design method according to item (11), wherein the GUI display means includes: a GUI element having a capability of changing the displayed performance indexes, and a feedback means for, when the performance indexes are changed by the GUI element, updating the design parameters stored in the profile, corresponding to the changed performance indexes.

(13) A computer-readable recording medium storing a program for executing the UML design method set forth in any one of items (7) to (12).

The present invention can apply not only for the highest up-stream process of ASIC (Application Specific Integrated Circuit) design represented by a SoC, which is configured with complicated combination of hardware and software, but also for the highest up-stream process of an application software system constituted by a large amount of software modules.

Although the preferred embodiments of the present invention have been described in detail, it should be understood that various changes, substitutions and alternations can be made therein without departing from spirit and scope of the inventions as defined by the appended claims.

The present invention can be realized in hardware, software, or a combination of hardware and software. It may be implemented as a method having steps to implement one or more functions of the invention, and/or it may be implemented as an apparatus having components and/or means to implement one or more steps of a method of the invention described above and/or known to those skilled in the art. A visualization tool according to the present invention can be realized in a centralized fashion in one computer system, or in a distributed fashion where different elements are spread across several interconnected computer systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein; and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or after reproduction in a different material form.

Thus the invention includes an article of manufacture which comprises a computer usable medium having computer readable program code means embodied therein for causing one or more functions described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A Unified Modeling Language design method used in a computer system, and a System On A Chip comprising at least a control circuit, a memory device, and a Graphical User Interface, and for performing design by modeling a target system based upon Unified Modeling Language using a profile storing a design parameter, comprising:

a step of setting the profile by storing a stereotype and a tagged value concerning a specific matter region in the profile as design parameters, wherein an object is generated for each configuration element of said System On A Chip and a Unified Modeling Language class map is generated that shows each object with relationships between each said object, and wherein each said object included in said Unified Modeling Language class map is annotated using major non- functional elements read out from said profile and are required for the design of said System On A Chip;

a step of adding the design parameters to the Unified Modeling Language model of the target system using the profile;

a step of determining user input for at least one of: performing performance evaluation by simulation or performing performance evaluation using a performance evaluation model;

a step of acquiring a performance index of each configuration element of the System On A Chip by analyzing the Unified Modeling Language class map;

a step of storing the performance index in a record in the profile;

a step of generating a performance evaluation model by a performance evaluation model generation unit based on the performance index;

a step of preparing a performance evaluation model, if performing performance evaluation using a performance evaluation model is chosen, based upon the design parameters added to the Unified Modeling Language model of the target system and for acquiring performance indexes of the target system from the performance evaluation model, and wherein if performing performance evaluation by simulation is chosen, simulating the Unified Modeling Language model of the target system and for acquiring performance indexes of the target system for a simulation execution result, wherein a simulation execution unit generates executable codes based on said annotated Unified Modeling Language class map;

a step of simulating an operation of the System On A Chip by executing the executable codes;

a step of calculating a performance evaluation of each configuration element of the System On A Chip using the simulation execution result or the performance evaluation model generated in the performance evaluation model generation unit;

a step of calculating an overall performance evaluation of the entire System On A Chip using the simulation execution result or the performance evaluation model generated in the performance evaluation model generation unit;

a step of storing the simulation execution result in a record in a simulation log storage unit;

a step of calculating the occupied rate of a bus by adding up the time used for transfers in a bus master stored in the simulation log storage unit, and dividing the occupied rate of the bus by the simulation time;

a step of accumulating and storing the acquired performance indexes in the memory device and storing the performance evaluation of each configuration element of the System On A Chip and the overall performance evaluation of the entire System On A Chip in a performance evaluation storage unit;

a step of associating the design parameters with the Unified Modeling Language model of the target system using the profile and displaying the associated design parameters and the Unified Modeling Language model of the target system on the Graphical User Interface, wherein the Graphical User Interface has a Graphical User Interface element having a capability of changing the acquired performance indexes to be displayed, and conducts a step of, when the acquired performance indexes are changed by the Graphical User Interface element, changing the design parameters stored in the profile corresponding to the changed performance indexes, and when the accumulated and stored performance indexes required for an architecture design of the target system are selected, the Graphical User Interface visually and quantitatively displays performance of the target system based upon the selected accumulated and stored performance indexes and all other accumulated and stored performance indexes;

a step of determining whether a command for re-calculation of performance evaluation based on a changed performance index was input by a user; and a step of updating tagged values in the profile based on the changed performance index when a re-calculation button is pressed and performance indexes have been changed by slider controls.

2. The Unified Modeling Language design method according to claim 1, wherein the stereotype and the tagged value are set by Real Time Unified Modeling Language.

3. The Unified Modeling Language design method according to claim 1, wherein the stereotype and the tagged value include design parameters relating to time constraints for processing the target system and resource constraints of the target system, and the stereotype and the tagged value are annotated to the Unified Modeling Language model of the target system and presented on a Graphical User Interface display.

* * * * *